United States Patent
Stucke

[11] Patent Number: 5,335,146
[45] Date of Patent: Aug. 2, 1994

[54] HIGH DENSITY PACKAGING FOR DEVICE REQUIRING LARGE NUMBERS OF UNIQUE SIGNALS UTILIZING ORTHOGONAL PLUGGING AND ZERO INSERTION FORCE CONNETORS

[75] Inventor: Robert F. Stucke, Saugerties, N.Y.

[73] Assignee: International Business Machines Corporation, Armonk, N.Y.

[21] Appl. No.: 827,240

[22] Filed: Jan. 29, 1992

[51] Int. Cl.$^5$ .............................. H01R 23/68
[52] U.S. Cl. .................... 361/785; 361/736; 361/744; 361/748; 361/761; 361/784; 361/796; 174/260; 439/64
[58] Field of Search ............ 361/392, 386, 393, 394, 361/395, 396, 397, 399, 400, 401, 410, 412, 413, 415, 785, 728, 724, 729, 730, 736, 744, 748, 752, 760, 761, 778, 784, 796; 174/260; 439/64, 257–268, 377, 65

[56] References Cited

U.S. PATENT DOCUMENTS

| | | | |
|---|---|---|---|
| 3,368,115 | 2/1968 | Hoffman | 317/101 |
| 4,232,924 | 11/1980 | Kline et al. | 339/17 L |
| 4,266,839 | 5/1981 | Aikens | 339/75 MP |
| 4,401,351 | 8/1983 | Record | 339/17 LM |
| 4,451,107 | 5/1984 | Dola et al. | 339/143 R |
| 4,490,000 | 12/1984 | Asick et al. | 339/17 LM |
| 4,498,717 | 2/1985 | Reimer | 339/17 LM |
| 4,582,386 | 4/1986 | Martens | 339/176 M |
| 4,603,928 | 8/1986 | Evans | 339/17 LM |
| 4,613,193 | 9/1986 | Beers | 339/17 L |
| 4,631,637 | 12/1986 | Romania et al. | 361/413 |
| 4,703,394 | 10/1987 | Petit et al. | 361/413 |
| 4,744,006 | 5/1988 | Duffield | 361/413 |
| 4,815,979 | 3/1989 | Porter | 439/62 |
| 4,838,798 | 6/1989 | Evans et al. | 439/61 |
| 4,863,395 | 9/1989 | Babuka et al. | 439/260 |
| 4,876,630 | 10/1989 | Dara | 361/413 |
| 4,907,977 | 3/1990 | Porter | 439/74 |
| 4,932,885 | 6/1990 | Scholz | 439/79 |
| 4,936,785 | 6/1990 | Krug et al. | 439/75 |
| 5,091,822 | 2/1992 | Takashima | 361/384 |
| 5,119,273 | 6/1992 | Corda | 361/413 |
| 5,211,565 | 5/1993 | Krajewski et al. | 439/65 |

FOREIGN PATENT DOCUMENTS

| | | | |
|---|---|---|---|
| 2320202 | 11/1974 | Fed. Rep. of Germany . | |
| 0220677 | 5/1987 | France . | |
| 8304466 | 12/1983 | PCT Int'l Appl. . | |
| 1193847 | 11/1985 | U.S.S.R. | 361/422 |
| 1313641 | 4/1973 | United Kingdom . | |

Primary Examiner—Leo P. Picard
Assistant Examiner—Young Whang

[57] ABSTRACT

A high density interconnection technique for connecting large numbers of unique signal lines between orthogonally positioned circuit cards, utilizes pins from the back of a zero insertion force connector (ZIF) to extend through the interconnection card and mate with a female socket connector on a second circuit board. Pins from the ZIF connector which are not aligned with the sockets of the orthogonally positioned socket connector may be connected to pins on the interconnection card which are aligned with the socket connector but not the ZIF. Very high numbers of connections between circuit cards may be made in a small volume and maintain signal line length at a minimum to ensure maximum signal transfer speed.

3 Claims, 2 Drawing Sheets

HIGH DENSITY PACKAGING FOR DEVICE REQUIRING LARGE NUMBERS OF UNIQUE SIGNALS UTILIZING ORTHOGONAL PLUGGING AND ZERO INSERTION FORCE CONNETORS

FIELD OF THE INVENTION

The invention relates to the packaging of electronic circuits, and particularly to the interconnecting of the electronic circuits to other devices and circuits which require large numbers of interconnections. The invention is particularly useful in the area of crosspoint switching or to the area of parallel processing where several computer processors require access to the same switch network, memory or other system resource.

BACKGROUND OF THE INVENTION

When large numbers of unique signal connections are required to interconnect the elements of an electrical network, such as the signal inputs and outputs of crosspoint switch elements or devices, the connection of the inputs and outputs to the switch device can require extensive circuit board complexity and interconnection distance design to provide the conductor paths on the circuit board necessary to make the interconnections. Further complications result from the requirement that in many cases, conductor paths between related inputs and connections to the crosspoint switching device be of equal length to make sure that all signals reaching the switching device are delayed by approximately the same amount of time.

This requirement for large numbers of unique signals exists in several environments but is very prevalent in the area of parallel processing. When a computer is comprised of several processors operating simultaneously, the signals to and from each other or shared memory through a switch network necessitates many point-to-point connections and must all be timed to arrive at the receiving device at approximately the same time, and all the processors must be able to access the memory which is common to all processors.

The cost of the interconnection of the crosspoint switching chips or devices to the input and output signal boards can become a significant cost element in an overall system.

U.S. Pat. No. 3,368,155, to N. E. Hoffman addresses the need to package several circuit boards in a module. This approach does not address the need for large numbers of unique signals needed in the environment of the invention.

U.S. Pat. No. 4,401,351 to G. C. Record discloses a card cage approach to interconnecting several circuit boards to a mother board, but fails to disclose a further interconnection by orthogonal plugging of other boards. Mother boards in adjacent cages are connected by a coupling means.

U.S. Pat. No. 4,490,000 to J. C. Asick et al discloses a device for interconnecting two adjacent parallel circuit boards but does not disclose the orthogonal interconnection of circuit boards.

U.S. Pat. No. 4,582,386 to J. D. Martins discloses a circuit board connector which provides electrical connections to a mating connector portion which has a pattern of four rows of pins uniformly spaced. Another example of a connector having receptors for pins and having multiple rows of receptors is U.S. Pat. No. 4,932,885 to J. P. Scholz.

SUMMARY OF THE INVENTION

It is an object of the invention to greatly increase the efficiency of making large numbers of interconnections between circuit boards.

It is a further object of the invention to reduce the need for designing large interconnection schemes for connecting circuit boards.

It is another object of the invention to make the interconnections between the connected circuit boards with a minimum of length of conductors.

The shortcomings of the prior art are overcome and the objects of the invention accomplished by the invention, a better understanding of which thereof may be had from the attached drawings and reference to the detailed description of the invention to follow.

DETAILED DESCRIPTION OF THE INVENTION

Figure 1:
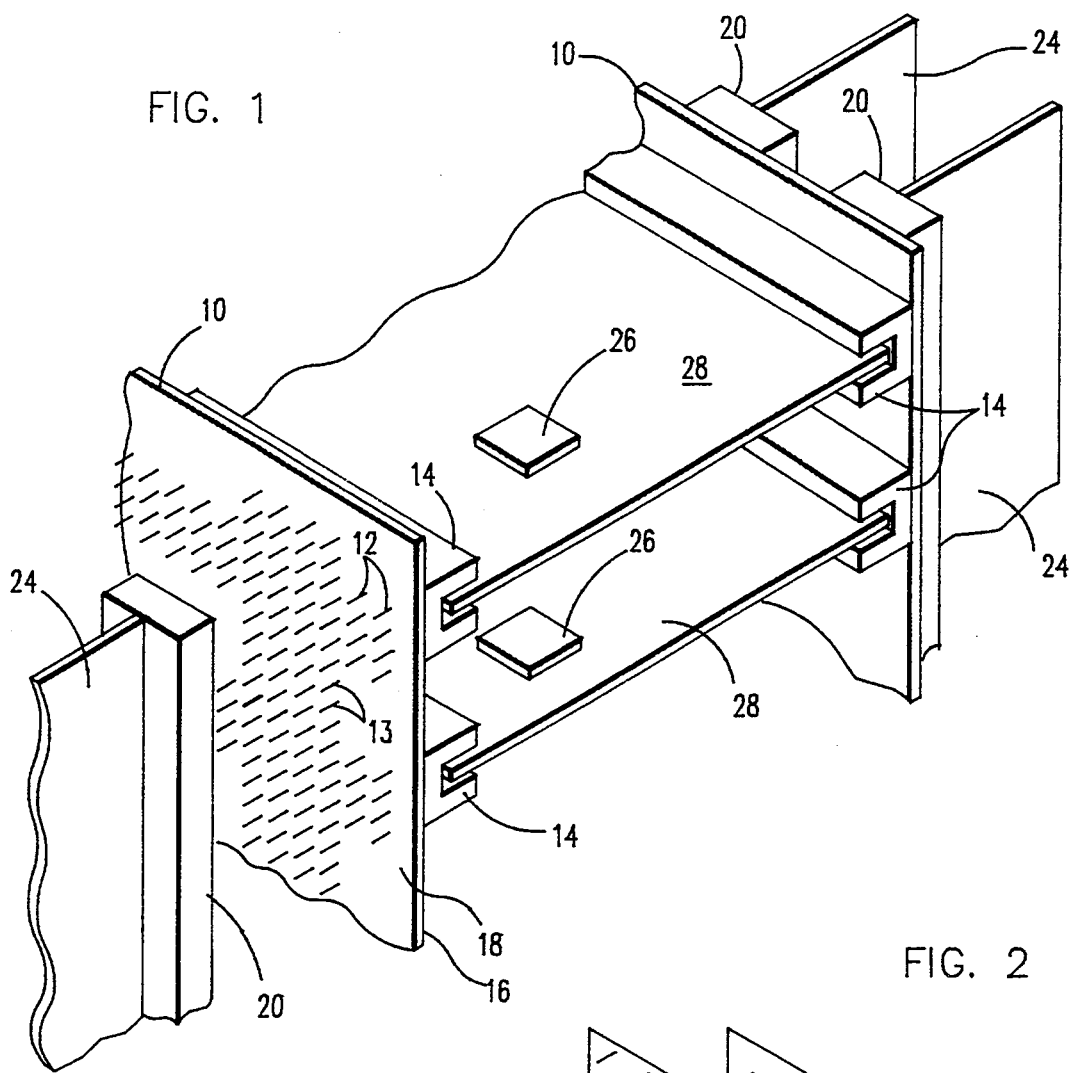
FIG. 1 is a view of an assembly of electronic circuit boards attached to the mounting boards, in a orthogonal arrangement.

Referring to FIG. 1, a first interconnection board 10 is shown oriented in a vertical plane. The interconnection board is populated with a plurality of pins 12 to which a circuit board connector 14 is connected or which are part of connector 14 and pins 13 to which a second, female circuit board connector 20 may be connected. For example, on a first face 16 of the interconnection board 10 there is mounted a Zero Insertion Force (ZIF) card edge connector 14. The ZIP connector 14 is of the type which is provided with pins 12 that can extend through the interconnection board 10 to expose the pins 12 on the second face 18 of interconnection board 10. In addition to the pins 12 directly in electrical communication with contacts of the ZIP connector 14, the second face 18 of the interconnection board 10 has pins 13 protruding therefrom. The pins 13 are not a part of the ZIF connector 14 but rather are connected, by electrical conductors on or contained in interconnection board 10, to those pins 12 which are not plug connected to connector 20. The connection of pins 12 to pins 13 will be described later with respect to FIG. 3.

Figure 3:
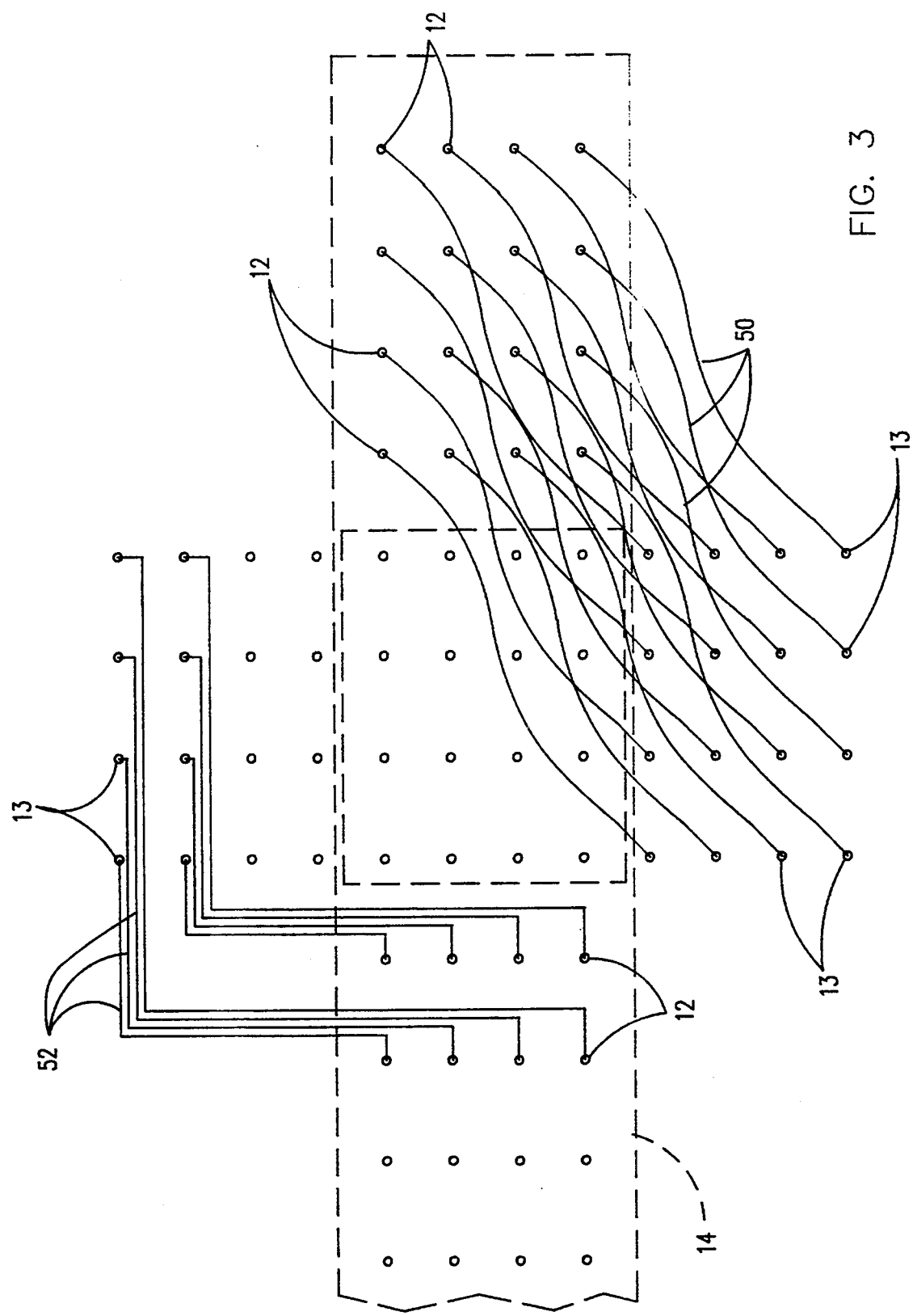
FIG. 3 illustrates the local wiring arrangement for interconnecting pins that do not intersect with the connector on the outboard circuit boards to pins that will engage the connector.

Connector 20 is a conventional female connector with a plurality of rows of sockets oriented so the rows of sockets are vertical. As can be seen in FIG. 3, the pins 12 which lie in the zone 42 which may be received by the sockets of connector 20, coincide with the pin locations for some of the pins 12 extending through interconnection board 10 from the back of ZIF connector 14. Pins 12 which extend through the interconnection board 10 from the back of ZIF connector 14 but which are not within zone 42 may be connected to pins 13 on an as needed basis to permit the conduction of signals between some of the pins 12 and pins 13. All of pins 13 lie within zone 42.

Connected to connector 20 in a conventional manner is circuit board 24. If used to package fiber-optic crosspoint switches, for example, a circuit board 24 may be a signal board which receives signals in, for example, a fiber optical input form from a source external to the package described. The signals could then be converted using an optical to electrical converter as are readily available commercially. Such optical to electrical converters are conventional and readily available commercially. The signals, once converted to electrical signals are then conducted to the using device 26 on the circuit boards 28. Boards 28 are engaged by their edges 30 and the contacts thereon, by the ZIF connector 14. The utilizing device 26 could be a crosspoint switching chip or a computer chip, or it could just as appropriately be a memory chip which may be accessible by processors which may reside on board 24. In any event, the number of interconnections between the input/output board 24 and the circuit board 28 may be significantly increased over the number of connections possible with non-orthogonal layout, and with minimal local board wiring.

The orthogonal arrangement of board 24, and board 10 and board 28 permits the connection of board 24 to multiple boards 28 without long runs of local board wiring. Referring to FIG. 3, zone 42 includes direct pin connections to boards 24 and 28 simultaneously. As can be seen from the pin layout on interconnection board 10 and the use of a four row pin arrangement on the ZIF connector 14 and on the connector 20, at each intersection of the plane of board 24 with the plane of board 28, sixteen direct pin interconnections are available. By including three adjacent columns of pins 12 on either side of zone 22 and three rows of pins 13 above and below the pins 12 extending directly from ZIF connector 14 through the board, the number of connections from the board 24 to board 28 amounts to forty at each intersection of the circuit boards 24, 28.

Assuming that a uniform pin spacing of 0.100 inches (2.54 mm), a common standard in pin connection technology, is used, the pitch between adjacent boards could be as close as one inch (25.4 mm). With pitches of one inch (25.4 mm), and 40 connections per square inch are achieved on the interconnection board 10.

FIG. 1 illustrates only two vertical boards 24 and two horizontal boards 28. By lengthening the boards, the number of connections may be increased to handle addition boards; for example, on a board having an edge dimension of four inches (10.16 cm) with boards connected on one inch (25.4 mm) intersection spacings, the number of connections possible are 640 in a 4 inch by 4 inch area. This number of connections may be doubled if the opposite side of each circuit board 28 is similarly mounted in a second ZIF connector 14 on a second interconnection board 10.

Accordingly, a module measuring approximately 4 inches by 4 inches by 12 inches is capable of having 1280 unique signal connections within the module.

Some of the pin interconnections may be used for voltage or ground connections between boards, simplifying the powering of the elements mounted to the various circuit boards.

Referring to FIG. 1, the ZIF connector 14 mounted on boards 10 may advantageously be the type having a slot through which the board edge is inserted along a direction parallel to the axis of the ZIF connector 14. This permits insertion of and removal of boards 28 into and from the structure defined by the two parallel boards 10 when boards 10 are rigidly mounted.

Figure 2:
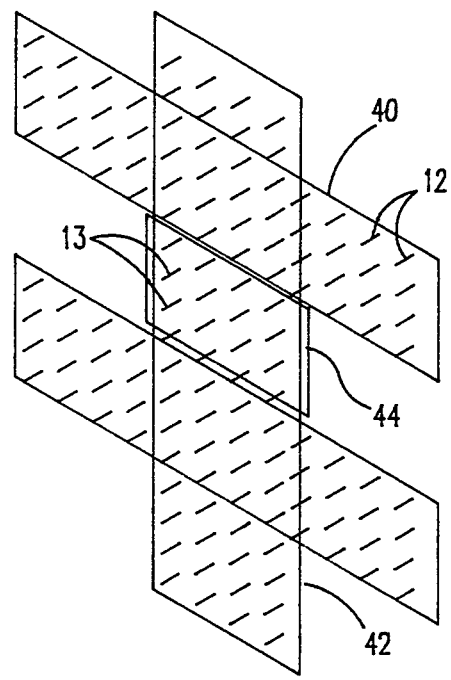
FIG. 2 illustrates the electrical connections of the Zero Insertion Force connectors through the connection board.

FIG. 2 shows the connections of the ZIF connector 14 within boundary 40. The connections 12 are arranged in four rows, equally spaced apart and protruding through the board 10. The pins 12 of the ZIF connector 14 are positioned in the holes of the board 10 and soldered to complete the mounting of the ZIF connector 14. The pins 13 protrude from the board in a pattern of typically four columns and occupying the area enclosed by boundary 42, between the connections of two adjacent ZIF connectors 14.

Boundary 44 encloses the connections that will be contacted by the female connector 20 of FIG. 1. It is seen that some of the connections protruding from ZIF connector 14 and the connections within boundary 42 are contacted by female connector 20. The connection pins that are common to the ZIF connector 14 and the female connector 20 do not require further electrical connection to serve their intended purpose. However, the pin connections which are within boundary 40 and not within boundary 42 must be connected to the pin connections within boundary 42 in order for the electrical signals on one group of pins to be conveyed to the other group of pins.

In order to connect the non-connected pins of ZIF connector 14 to the non-connected pins that engage female connector 20, local wiring must be accomplished. The local wiring is formed by conventional printed circuit board fabrication techniques. Conductors 50 are formed in the board 10 during the board manufacture and may be positioned to connect pins of one of the groups to a pin in another of the groups of non-common pin connections. For example, a pin 12 in one group may be connected to a pin 13 in another group by a conductor 50 as shown in FIG. 3. Conductors 50 are laid out with a desire to maintain all connections between non-common pins approximately equal. Conductors 52 are examples of a layout connecting pins 12 and 13 on board 10 when the length of the conductors relative to each other is not a critical consideration. Should it become necessary to lay out very intricate patterns of conductors to property connect selected ones of pins 12 with selected ones of pins 13, multiple layers of conductors may be formed and separated by insulating layers as is well known in the circuit board art.

It should be understood that the use of ZIF connectors 14 and female connectors 20 are described for illustrative purposes and that all connections of the board 10 could be made with ZIF connectors or by female connectors. Such connectors limit to some extent the flexibility of the design. The combination of ZIF connectors 14 and female connectors 20 is the preferred design.

While the local wiring of board 10 is preferably accomplished as described above, it should be understood that this structure is also conducive to wire wrap interconnections and thus is useful in early level prototype designs. After the interconnections have proven to be as desired, the wiring approach may then give way to the local wiring of the circuit board during its manufacture and the total enclosure of the conductors within the board.

The female connectors 20 have been shown as pin into socket type connectors but it should be recognized that a ZIF connector could be substituted; the connector could also be of the surface mount type where the board 10 would be provided with solder pads rather than pins 13 for engaging the ZIF connector.

From the foregoing description and explanation, it is appreciated that a third edge of circuit board 28, preferably the leading edge as board 28 is inserted into the connectors 14, may be contacted by conventional connectors to provide power or signal connections to the circuit board 28. If air circulation is not required for cooling the components 26, an interconnection board 10 can be added to the back of the arrangement shown in FIG. 1 to further expand the interconnection capability between circuit board 28 and circuit boards 24 or their counterparts.

Further, it should be understood that modifications and changes may be made by one of skill in the art to the preferred embodiment without departing from the scope of the invention.

We claim:

1. A high density packaging system for interconnecting a plurality of circuit cards, said plurality of circuit cards comprising at least a first set, a second set and a third set of said circuit cards;

said circuit cards comprising electrical components, wherein said first set of said circuit cards comprises first electrical connectors disposed along a first edge of said circuit cards of said first set and, wherein said third set of said circuit cards comprises a first plurality of electrical connectors disposed along a first edge of said circuit cards of said third set, and wherein said second set of said circuit cards comprises a first plurality of electrical connection points disposed along at least two edges of each of said cards of said second set, said edges being parallel and disposed on opposite edges of said cards;

said first plurality of electrical connectors and said first plurality of electrical connectors and said first plurality of electrical connection points being electrically connected to at least some of said electrical components on said plurality of said circuit cards;

a first interconnection circuit board disposed intermediate said first set of said circuit cards and said second set of said circuit cards;

a second interconnection circuit board disposed intermediate said second set of said circuit cards and said third set of said circuit cards;

said first and second interconnection circuit boards each disposed parallel to the other and a first surface of said first interconnection circuit board facing toward a first surface of the second interconnection circuit board;

a second plurality of connectors disposed on said first surface of each of said interconnection circuit boards, said second plurality of connectors being zero insertion force connectors with an insertion axis parallel to a long axis of said zero insertion force connectors;

a second plurality of connection points disposed on a second surface of each of said interconnection circuit boards opposite said first surfaces of said interconnection circuit boards, said second plurality of connection points disposed to engage said first plurality of electrical connectors of said first set of circuit cards and said third set of circuit cards, when said first set and said third set of circuit cards are oriented orthogonally with respect to said second set of circuit cards; and electrical interconnection paths, including said plurality of connection points connecting each of said first connectors to at least one of said plurality of said second connectors located on said first surface of said first and second interconnection boards;

whereby individual ones of said second set of circuit cards are inserted into said at least two of said second plurality of connectors to establish contact with said circuit cards of said first set and circuit cards of said third set without having to disturb the spatial spacing of said interconnection circuit cards.

2. The packaging system of claim 1 wherein said plurality of first connectors comprise zero insertion force connectors having an insertion axis parallel to a long axis of said connector and parallel to an edge of one of said circuit cards of said second set.

3. A method of interconnecting a first set of circuit cards and a third set of circuit cards with a second set of circuit cards, comprising the steps of:

providing at least two interconnection circuit boards, each having at least first and second parallel faces;

positioning said interconnection circuit boards parallel to and spaced from each other;

providing on at least a first face of each said interconnection board a plurality of zero insertion force connectors having an insertion axis parallel to said first face of said interconnection board, each said connector disposed parallel to all said connectors;

providing a plurality of electrical connection points on said second face of each of said interconnection boards;

disposing a first plurality of circuit cards in electrical connection with said electrical connection points on said second face of each of said interconnection cards and disposed orthogonally with respect to said zero insertion force connectors;

inserting at least a second plurality of circuit cards into said zero insertion force connectors along said insertion axes with each said card of said second plurality of circuit cards disposed with two opposing edges each within a zero insertion force connector, one said zero insertion force connector residing on each of said interconnection circuit boards;

whereby each of said first plurality of circuit cards is electrically connected with said second plurality of circuit cards.

* * * * *